United States Patent [19]

Sato et al.

[11] Patent Number: 5,114,908
[45] Date of Patent: May 19, 1992

[54] SUPERCONDUCTIVE CONDUCTOR

[75] Inventors: Kenichi Sato; Hidehito Mukai, both of Osaka, Japan

[73] Assignee: Sumitomo Electric Industries, Ltd., Osaka, Japan

[21] Appl. No.: 564,217

[22] Filed: Aug. 7, 1990

[30] Foreign Application Priority Data

Aug. 9, 1989 [JP] Japan ................. 1-207687

[51] Int. Cl.⁵ .................. H01B 12/00; H01B 12/02
[52] U.S. Cl. ........................... 505/1; 505/704; 505/884; 505/885; 505/887; 174/15.4; 174/15.5; 174/125.1
[58] Field of Search .......... 505/704, 884, 885, 886, 505/887, 1; 174/15.4, 15.5, 125.1

[56] References Cited

U.S. PATENT DOCUMENTS

| 3,461,218 | 8/1969 | Buchhold | 174/15.5 |
| 3,657,466 | 4/1972 | Woolcock et al. | 174/15.5 |
| 3,715,451 | 2/1973 | Hammer et al. | 174/15.5 |
| 3,749,811 | 7/1973 | Bogner et al. | 174/15.5 |

FOREIGN PATENT DOCUMENTS

| 285319 | 10/1988 | European Pat. Off. |  |
| 3343451 | 6/1985 | Fed. Rep. of Germany | 174/15.5 |
| 1463138 | 12/1966 | France |  |
| 1541728 | 9/1968 | France |  |
| 2146395 | 3/1973 | France |  |
| 1-3911 | 1/1989 | Japan |  |
| 1-204313 | 8/1989 | Japan |  |
| 2-1512 | 1/1990 | Japan |  |

Primary Examiner—Leo P. Picard
Assistant Examiner—Bot Ledynh
Attorney, Agent, or Firm—Pennie & Edmonds

[57] ABSTRACT

A superconductive conductor (1) is formed by at least three superconducting wires (3) comprising oxide superconductor members (4) and stabilizing members (5), which are point-symmetrically arranged in section. The superconducting wires (3) are so point-symmetrically arranged that electromagnetic force and magnetic fields provided by the respective superconducting wires (3) cancel each other, whereby it is possible to reduce distortion and influence by applied magnetic fields.

10 Claims, 1 Drawing Sheet

SUPERCONDUCTIVE CONDUCTOR

BACKGROUND OF THE INVENTION

1. Field of the Invention

The present invention relates to a superconductive conductor which is applied to a superconducting cable, or a current lead for supplying a current to a superconducting element such as a superconducting magnet or the like, and more particularly, it relates to an improvement in arrangement of a plurality of superconducting wires which are included in a superconductive conductor.

2. Description of the Background Art

An attempt has been made in the art to implement a superconducting cable using NbTi or $Nb_3Sn$. Such a superconducting cable is cooled by liquid helium. This type of superconducting cable is merely evaluated in property as a relatively short cable for experimentation.

On the other hand, a normal conductor such as a pipe-shaped copper conductor or a brass conductor is applied to a current lead for supplying a current to a superconducting element such as a superconducting magnet. Such a current lead is put into practice as an element for carrying a current to a superconducting magnet using NbTi or $Nb_3Sn$, for example. The current lead is so designed that its one end, which is connected to the superconducting magnet, is cooled by liquid helium for cooling the superconducting magnet while a portion upwardly projecting beyond the level of the liquid helium is efficiently cooled by evaporating helium gas.

However, the conventional superconducting cable must be cooled by liquid helium as described above, and hence it is necessary to cover the periphery of the cooled portion with heat insulating material in a high vacuum. Further, the running cost is increased due to employment of the liquid helium.

On the other hand, the conventional current lead is formed by a normal conductor using copper or brass, which has high thermal conductivity. Joule loss is caused due to a voltage drop of the member itself upon energization and that caused by contact resistance between the used members, to generate heat. This heat exerts influence upon a cooling medium such as liquid helium in which the superconducting magnet is dipped, whereby the cooling medium evaporates by conduction of the heat.

SUMMARY OF THE INVENTION

Accordingly, an object of the present invention is to provide a superconductive conductor capable of implementing a superconducting cable or a current lead, which can suppress the amount of evaporation of a cooling medium absolutely or substantially with no Joule loss caused by energization.

Another object of the present invention is to provide a superconductive conductor using an oxide superconductor which can attain a superconducting state at a temperature exceeding that of liquid helium and enabling increase of its critical current value.

In order to solve the aforementioned technical problems, the inventive superconductive conductor is characterized in that at least three superconducting wires comprising oxide superconductor members and stabilizing members are used and point-symmetrically arranged in section.

In concrete terms, such point-symmetrical arrangement of the superconducting wires is attained by a method of arranging the superconducting wires partially or entirely along a periphery having a circular or polygonal sectional configuration, a method of arranging superconducting wires having longitudinal sectional configurations so that the longitudinal directions or directions perpendicular thereto are radially directed from the center of point symmetry, or the like. The superconducting wires are preferably arranged to linearly extend along the longitudinal directions thereof.

Preferably cooling spaces are defined inside and outside the arranged superconducting wires in section.

The superconducting wires employed in the present invention may have rectangular sections, or tape-type configurations.

According to the present invention, at least three superconducting wires are point-symmetrically arranged so that electromagnetic force and magnetic fields provided by the superconducting wires cancel each other. Therefore, it is possible to reduce distortion and influence by applied magnetic fields.

Thus, according to the present invention, it is possible to obtain a superconductive conductor which has excellent superconduction properties such as a critical current.

According to the present invention, absolutely or substantially no Joule loss is caused by energization since the superconducting wires contain oxide superconductors, whereby the amount of evaporation of a cooling medium can be suppressed.

According to the present invention, further, employed are oxide superconductor members which can exhibit superconducting phenomenons at a temperature exceeding that of liquid helium. Thus, it is not necessary to employ liquid helium, which requires complicated equipment and a high cost.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
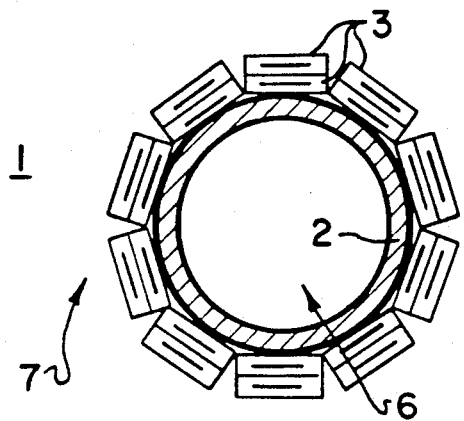
FIG. 1 is a sectional view showing a superconductive conductor 1 according to a first embodiment of the present invention.

FIG. 1 is a sectional view showing a superconductive conductor 1 according to a first embodiment of the present invention.

Figure 2:
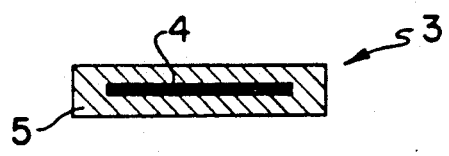
FIG. 2 is an enlarged sectional view of each superconducting wire rod 3 shown in FIG. 1.

The superconductive conductor 1 comprises a silver pipe 2 having a circular sectional configuration, and 20 tape-type superconducting wires 3 are point-symmetrically arranged in section along the outer periphery of the silver pipe 2 in a double-layered manner. Each superconducting wire 3 is 0.4 mm in thickness and 3.6 mm in width. FIG. 2 is an enlarged sectional view showing each superconducting wire 3, which comprises a BiPbSrCaCu oxide superconductor member 4 and a silver sheath 5 enclosing the same as a stabilizing member.

The superconductive conductor 1 has a cooling space 6 within the silver pipe 2, and defines another cooling space 7 which is enclosed by an insulator (not shown) in the exterior of its outer periphery.

In order to obtain such a superconductive conductor 1, superconducting wires 3 were prepared to attain a critical temperature of 106K, critical current density of 3800 A/cm$^2$ and a critical current of 36 A by heat treatment. These superconducting wires 3 were so arranged on the silver pipe 2 as to linearly extend along the longitudinal directions thereof, and subjected to heat treatment in the atmospheric air at 845° C. for 50 hours, whereby the oxide superconductor members 4 within the superconducting wires 3 were sintered and the silver sheaths 5 of the superconducting wires 3 were integrated with the silver pipe 2 as well as with each other by diffused junction. The length of the superconductive conductor 1 was 50 cm. After the heat treatment, the superconductive conductor 1 exhibited a critical current value of 612 A (upon generation of 1 $\mu$V) in liquid nitrogen.

For the purpose of comparison, a reference sample was prepared by densely combining the same superconducting wires 3 so that the combined member was quadrangular in section. This sample exhibited only a low critical current value of 387 A.

Second Embodiment

Figure 3:
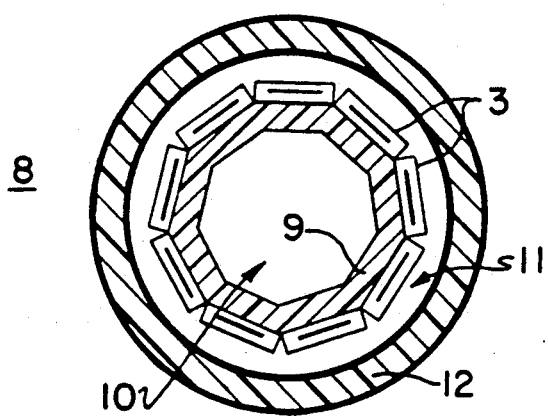
FIG. 3 is a sectional view showing a superconductive conductor 8 according to a second embodiment of the present invention.

FIG. 3 is a sectional view showing a superconductive conductor 8 according to a second embodiment of the present invention.

In order to obtain such a superconductive conductor 8, superconducting wires 3, which were similar to those of the first embodiment, were prepared by independently performing heat treatment. These superconducting wires 3 were fixed onto the outer peripheral surface of an FRP pipe 9, whose outer periphery was nonagonally molded, with an adhesive agent for low temperature service. A cooling space 10 was defined inside the FRP pipe 9, which was provided with holes (not shown) of 2 mm in diameter at intervals of 10 mm, in order to increase cooling efficiency of the cooling space 10. The superconducting wires 3 arranged in the aforementioned manner were enclosed by another FRP pipe 12 to define another cooling space 11. Several portions of the FRP pipe 12 were fixed by FRP spacers (not shown), in order to maintain the cooling space 11.

The superconductive conductor 8 was energized while introducing liquid nitrogen into the cooling spaces 10 and 11. This superconductive conductor 8 exhibited a critical current value of 310 A.

The superconductive conductor 8 was applied to a current lead for carrying a current to a magnet of NbTi in liquid helium. In this case, it was possible to reduce consumption of helium upon energization with 300 A to 50% as compared with a conventional current lead of copper.

Other Embodiments

Although the superconducting wires 3 were repared from silver-coated wires of BiPbSrCaCuO in the above embodiments, the oxide superconductor members may be prepared from a material whose critical temperature exceeds the liquid nitrogen temperature such as a material of YBaCuO, BiSrCaCuO, TlBaCaCuO, TlBaSrCaCuO, TlPbBaSrCaCuO or TlPbSrCaCuO, or an Nd system material. In place of the silver-coated wires, oxide superconductor members prepared by a physical film forming method such as sputtering, a chemical film forming method such as CVD, a unidirectional solidifying method, a spinning method or the like may be combined or coated with stabilizing members.

When at least three superconducting wires such as sectionally rectangular or tape-type wires have longitudinal sectional configurations, the superconducting wires may be so arranged that the longitudinal directions are radially directed from the center of point symmetry.

It is pointed out here that the term "point-symmetrical" employed in this specification is not restricted to "point-symmetrical" in correct geometric meaning as in the case of the superconducting wires 3 shown in FIG. 1, but also includes substantially point-symmetrical arrangement with respect to a prescribed center, as in the case of the superconducting wires 3 shown in FIG. 3.

Although the present invention has been described and illustrated in detail, it is clearly understood that the same is by way of illustration and example only and is not to be taken by way of limitation, the scope of the present invention being limited only by the terms of the appended claims.

What is claimed is:

1. A superconductive conductor comprising:
   at least three superconducting wires each comprising an oxide superconductor member and an electrically conductive stabilizing member enclosing said oxide superconductive member; and
   means for holding said superconducting wires so that said superconducting wires are point-symmetrically arranged in section wherein said superconducting wires have longitudinal sectional configurations and are so arranged that directions perpendicular to the longitudinal directions are radially directed from the center of point symmetry.

2. A superconductive conductor in accordance with claim 1, wherein said superconducting wires are arranged partially along a periphery having a circular sectional configuration.

3. A superconductive conductor in accordance with claim 1, wherein said superconducting wires are so arranged that longitudinal directions thereof linearly extend.

4. A superconductive conductor in accordance with claim 1, wherein cooling spaces are respectively provided inside and outside said point-symmetrically arranged superconducting wires in section.

5. A superconductive conductor in accordance with claim 1, wherein said superconducting wires have rectangular sectional configuration.

6. A superconductive conductor in accordance with claim 1, wherein said superconductive wires have tape-type configurations.

7. A superconductive conductor in accordance with claim 1, wherein said superconducting wires are arranged partially along a periphery having a polygonal configuration.

8. A superconductive conductor in accordance with claim 1, wherein said superconducting wires are arranged entirely along a periphery having a circular sectional configuration.

9. A superconductive conductor in accordance with claim 1, wherein said superconducting wires are arranged entirely along a periphery having a polygonal section configuration.

10. A superconductive conductor in accordance with claim 1, wherein said electrically conductive stabilizing member is made of silver.

* * * * *